United States Patent
Yen et al.

(10) Patent No.: US 10,418,476 B2
(45) Date of Patent: Sep. 17, 2019

(54) SILICON CARBIDE SEMICONDUCTOR DEVICE

(71) Applicant: Hestia Power Inc., Hsinchu (TW)

(72) Inventors: Cheng-Tyng Yen, Hsinchu (TW); Chien-Chung Hung, Hsinchu (TW); Chwan-Ying Lee, Hsinchu (TW)

(73) Assignee: HESTIA POWER INC., Hsinchu (TW)

( * ) Notice: Subject to any disclaimer, the term of this patent is extended or adjusted under 35 U.S.C. 154(b) by 109 days.

(21) Appl. No.: 15/596,782

(22) Filed: May 16, 2017

(65) Prior Publication Data

US 2017/0250275 A1    Aug. 31, 2017

Related U.S. Application Data

(63) Continuation-in-part of application No. 14/968,430, filed on Dec. 14, 2015, which is a continuation-in-part of application No. 14/668,299, filed on Mar. 25, 2015, now Pat. No. 9,246,016.

(30) Foreign Application Priority Data

Jul. 2, 2014    (TW) .............................. 103122787 A

(51) Int. Cl.
| | |
|---|---|
| *H01L 29/78* | (2006.01) |
| *H01L 29/10* | (2006.01) |
| *H01L 29/16* | (2006.01) |
| *H01L 29/06* | (2006.01) |
| *H01L 29/08* | (2006.01) |
| *H01L 29/45* | (2006.01) |
| *H01L 29/872* | (2006.01) |

(52) U.S. Cl.
CPC .......... *H01L 29/7806* (2013.01); *H01L 29/06* (2013.01); *H01L 29/0688* (2013.01); *H01L 29/0696* (2013.01); *H01L 29/086* (2013.01); *H01L 29/0869* (2013.01); *H01L 29/1608* (2013.01); *H01L 29/1095* (2013.01); *H01L 29/45* (2013.01); *H01L 29/872* (2013.01)

(58) Field of Classification Search
None
See application file for complete search history.

(56) References Cited

U.S. PATENT DOCUMENTS

| | | | |
|---|---|---|---|
| 6,621,107 B2 * | 9/2003 | Blanchard | ........... H01L 29/7806 257/155 |
| 6,979,863 B2 | 12/2005 | Ryu | |
| 7,151,280 B2 | 12/2006 | Hayashi et al. | |
| 9,209,293 B2 | 12/2015 | Hung et al. | |
| 9,246,016 B1 | 1/2016 | Yen et al. | |
| 2004/0183080 A1 | 9/2004 | Kusumoto et al. | |
| 2006/0202264 A1 | 9/2006 | Bhalla et al. | |
| 2007/0023830 A1 | 2/2007 | Pfirsch et al. | |

(Continued)

*Primary Examiner* — Walter H Swanson
*Assistant Examiner* — Kien C Ly
(74) *Attorney, Agent, or Firm* — Muncy, Geissler, Olds & Lowe, P.C.

(57) ABSTRACT

The present invention is related to a silicon carbide semiconductor device which employs a silicon carbide substrate to form an integrated device. The integrated device of the present invention comprises a metal oxide semiconductor field-effect transistor (MOSFET) and an integrated junction barrier Schottky (JBS) diode in an anti-parallel connection with the MOSFET.

10 Claims, 10 Drawing Sheets

(56) References Cited

U.S. PATENT DOCUMENTS

| | | | |
|---|---|---|---|
| 2008/0067584 A1* | 3/2008 | Lui | H01L 21/823487 |
| | | | 257/330 |
| 2009/0218621 A1 | 9/2009 | Pfirsch et al. | |
| 2009/0283776 A1 | 11/2009 | Iwamuro | |
| 2011/0297893 A1* | 12/2011 | Seki | C30B 15/00 |
| | | | 252/512 |
| 2012/0161210 A1* | 6/2012 | Heinrich | H01L 29/0847 |
| | | | 257/288 |
| 2012/0223339 A1 | 9/2012 | Mizukami | |
| 2012/0286290 A1 | 11/2012 | Uchida | |
| 2013/0026568 A1* | 1/2013 | Bhalla | H01L 29/66712 |
| | | | 257/337 |
| 2013/0248883 A1 | 9/2013 | Das et al. | |
| 2013/0277688 A1 | 10/2013 | Nakano | |
| 2013/0313569 A1 | 11/2013 | Usagawa | |
| 2013/0313570 A1 | 11/2013 | Sdrulla et al. | |
| 2013/0313576 A1 | 11/2013 | Nakano | |
| 2014/0175559 A1 | 6/2014 | Hung et al. | |
| 2014/0231828 A1 | 8/2014 | Horikawa et al. | |
| 2014/0299887 A1 | 10/2014 | Matocha et al. | |
| 2014/0332858 A1 | 11/2014 | Chen et al. | |
| 2015/0001553 A1 | 1/2015 | Kudou et al. | |
| 2015/0028351 A1 | 1/2015 | Van Brunt et al. | |
| 2015/0084063 A1 | 3/2015 | Van Brunt et al. | |
| 2015/0084066 A1 | 3/2015 | Banerjee et al. | |
| 2015/0084119 A1 | 3/2015 | Pala et al. | |
| 2015/0084125 A1 | 3/2015 | Pala et al. | |
| 2015/0123148 A1 | 5/2015 | Nakano et al. | |
| 2015/0206967 A1 | 7/2015 | Hayashi et al. | |
| 2015/0236012 A1 | 8/2015 | Hino et al. | |
| 2015/0372092 A1 | 12/2015 | Yamamoto et al. | |
| 2016/0163800 A1 | 6/2016 | Sakai | |
| 2018/0337081 A1* | 11/2018 | Ye | H01L 21/6833 |

\* cited by examiner

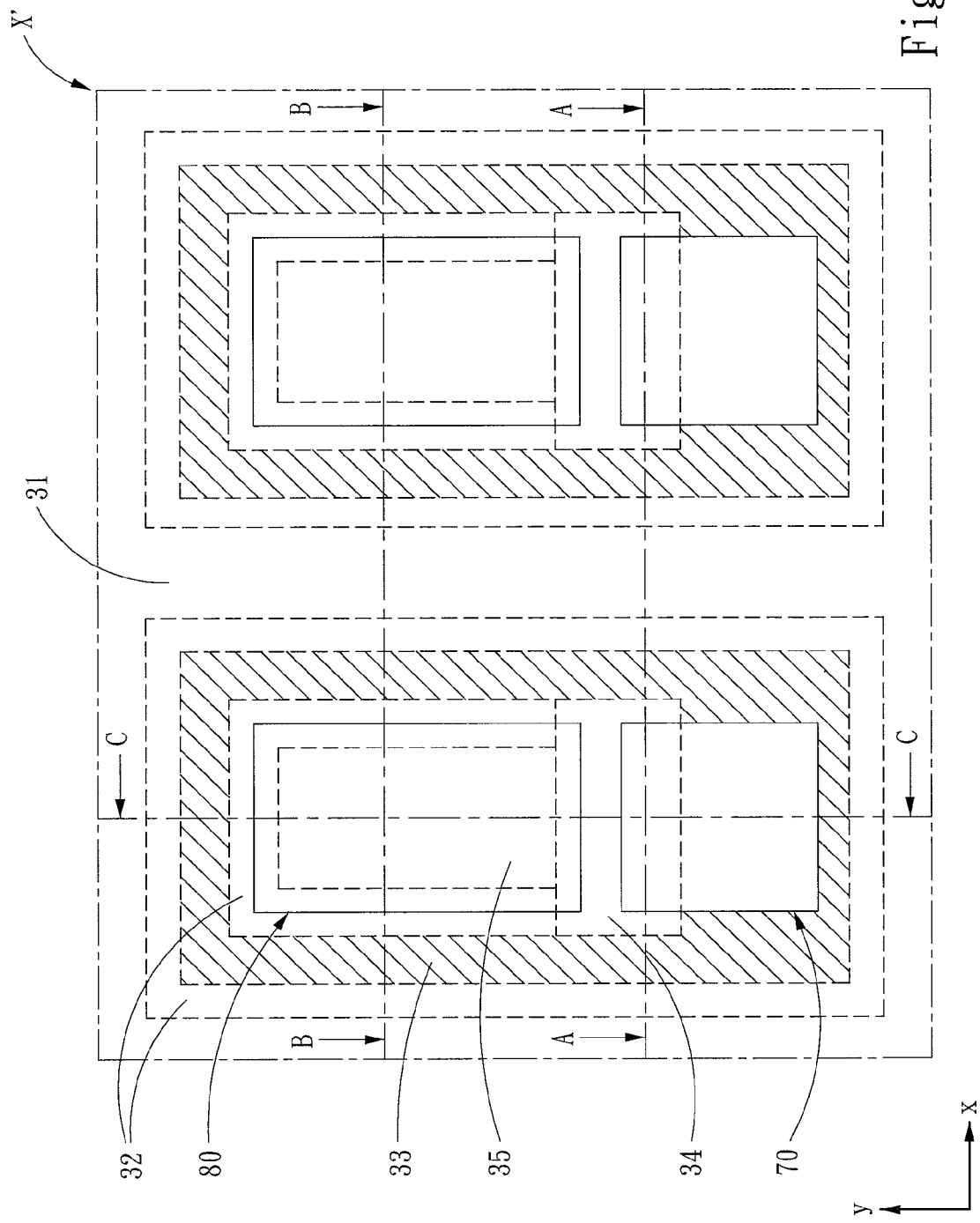

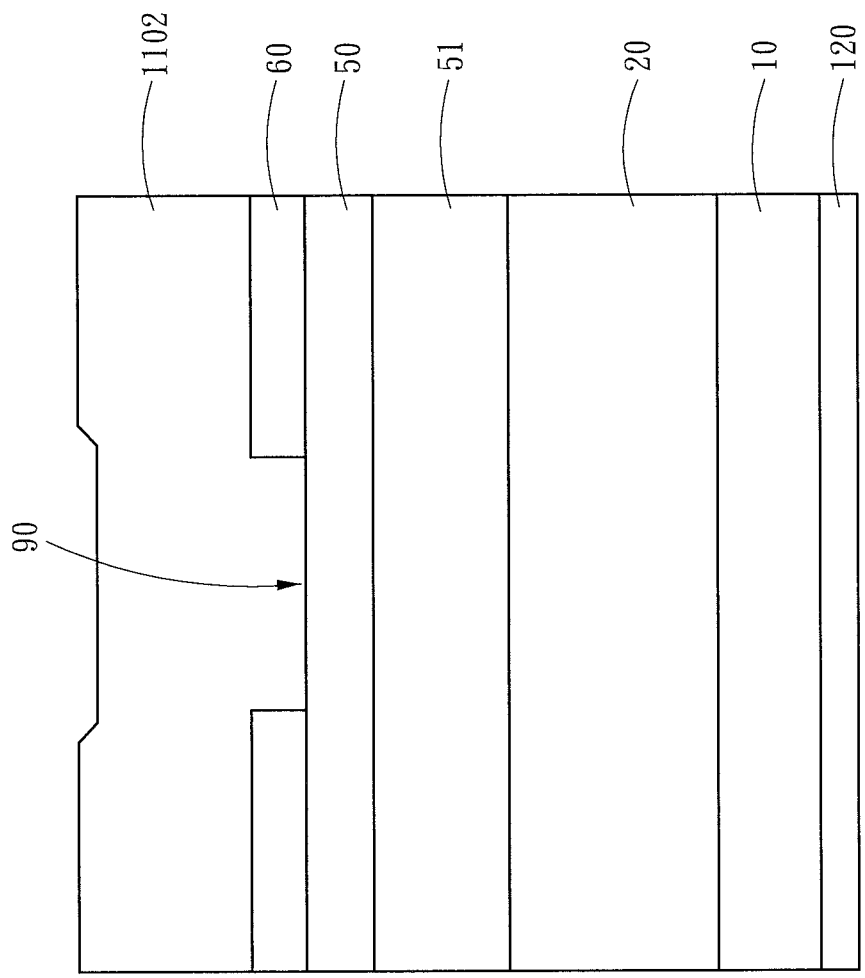

SILICON CARBIDE SEMICONDUCTOR DEVICE

This is a continuation-in-part, and claims priority, from U.S. patent application Ser. No. 14/968,430 filed on Dec. 14, 2015, entitled "SILICON CARBIDE SEMICONDUCTOR DEVICE" which is a continuation-in-part of U.S. patent application Ser. No. 14/668,299 filed on Mar. 25, 2015, entitled "SILICON CARBIDE SEMICONDUCTOR DEVICE", the entire contents of which are hereby incorporated by reference.

FIELD OF THE INVENTION

The present invention relates to a silicon carbide semiconductor device. More particularly, it relates to a silicon carbide MOSFET integrated with a Schottky diode having a low specific on-resistance.

BACKGROUND OF THE INVENTION

Power semiconductor devices should provide the minimum possible turn-on resistance, reverse leakage current and high switching speed at the rated breakdown voltage, to reduce the operational conduction loss and switching loss. The wide bandgap (Eg=3.26 eV), high threshold field of dielectric breakdown (2.2 MV/cm) and high thermal conductivity (4.9 W/cm-K) of silicon carbide (SiC) make it an ideal material for power switching devices. The thickness of voltage supporting layer (a low doping concentration drift layer) of power devices made of SiC is one-tenth of that made of silicon at the same rated blocking voltage, and the theoretical conduction resistance of SiC power devices can be hundreds times lower than Si power devices.

However, the wide bandgap of SiC also makes the turn-on voltage of body diode of SiC metal oxide semiconductor field effect transistor (MOSFET) reach to nearly 3V, which will result in a larger loss during switching and limit the switching speed. Furthermore, the basal plane dislocations in SiC drift layer will expand into stacking faults due to recombination of carriers during the forward conducting of body diode. SiC MOSFET may degrade or even fail due to these stacking faults. Therefore, a SiC MOSFET sometimes co-packages an anti-parallelly connected SiC Schottky diode externally to increase the operating speed, reduce switching loss and avoid reliability issues brought by stacking faults.

The U.S. Pat. No. 9,209,293 provides an integrated device, in which junction barrier Schottky (JBS) diodes are embedded in a metal oxide semiconductor (MOS) field-effect transistor cell array. The integrated device includes a plurality of areas, each area comprising: a plurality of MOS transistor cells, wherein any two adjacent MOS transistor cells are separated by a separating line, and wherein a first MOS transistor cell and a second MOS transistor cell are adjacent in a first direction and separated by a first separating line, and the first MOS transistor cell and a third MOS transistor cell are adjacent in a second direction and separated by a second separating line, wherein the MOS transistor cells of each area comprises a plurality of well regions of a second conductivity type, and any two adjacent well regions are separated by one of the separation lines; a drift layer of the first conductivity type, disposed on a substrate, wherein the well regions are disposed in the drift layer; at least one JBS diode, disposed in the drift layer at an intersection region between the first separating line and the second separating line, wherein the JBS diode is connected in anti-parallel to the first, second and third MOS transistor cells, wherein the at least one JBS diode comprises a plurality of first junction barrier regions of the second conductivity, disposed in the middle of the drift layer of the intersection region and the plurality of first junction barrier regions extend into corners of the well regions; a plurality pf source regions of a first conductivity, disposed in the middle of the well regions; a plurality of body regions of the second conductivity type, disposed in the middle of the source regions in the well regions; a plurality of source contacts, disposed on and electrically connected to the body regions and a portion of the source regions; a first anode contact, covering a portion of the first junction barrier regions and a portion of the drift layer and electrically connected to the source contacts and the first junction barrier regions; and a cathode, disposed in the substrate below the drift layer.

Also as the U.S. Pat. No. 6,979,863, in addition to the metal oxide semiconductor field-effect transistor cells, it allocates extra areas to form junction barrier Schottky diodes in an anti-parallel connection.

In the above-identified techniques, the JBS diodes provided in the U.S. Pat. No. 9,209,293 are disposed in the intersection regions between the two adjacent MOS transistor cells. In other words, the JBS diodes occupy the area of a portion of the well regions and a portion of the separating lines respectively. In this way, the channel width (Wch, in the unit of μm) of one MOS transistor cell will be reduced. On the other hand, the U.S. Pat. No. 6,979,863 an additional chip area is required to be allocated for the JBS diode, and there is no transistor channel in the portion of that chip area. Both of the two disclosures will reduce the total channel width per unit area (μm/cm$^2$) of the chip, resulting in a decrease of the transistor current density flowing through the integrated device and an increase of the transistor specific on-resistance (the product of the transistor on-resistance and chip area, in the unit of mΩ·cm$^2$).

SUMMARY OF THE INVENTION

In view of the foregoing, the present invention is provided to solve the problem that a portion of the channel widths or chip areas of the conventional JBS integrated SiC semiconductor devices has to be allocated for the JBS diode, thereby resulting in a higher transistor specific on-resistance.

In order to achieve the objective, the present invention provides a silicon carbide semiconductor device comprising a substrate, an n-type drift layer, a plurality of doped regions, a gate dielectric, a gate electrode, an interlayer dielectric, a plurality of source openings, a plurality of junction openings, a plurality of gate openings, a first metal layer and a second metal layer. The substrate is n-type heavily doped. The n-type drift layer is disposed on the substrate and has a first doping concentration. The doped regions are spaced apart and disposed on the n-type drift layer, and a first junction field-effect region is formed between the doped regions. The doped region has a p-type well, a plurality of n-type heavily doped regions disposed in the p-type well, a plurality of p-type heavily doped region adjacent to the n-type heavily doped region and overlapping with a portion of the p-type well, and a plurality of the second junction field-effect regions enclosed by the p-type well. The gate dielectric is disposed on the n-type drift layer, the gate electrode is on the gate dielectric, and the interlayer dielectric is on the gate dielectric and the gate electrode. The source opening passes through the interlayer dielectric and the gate dielectric until a portion of the n-type heavily doped region and a portion of the p-type heavily doped region are reached. The junction opening passes through the interlayer dielectric and the gate dielectric until the second junction field-effect region, a portion of the p-type well and a portion of the p-type heavily doped region are reached. The gate opening opens through the interlayer dielectric to the gate electrode. The first metal layer is disposed at the bottom of the source opening to form an Ohmic contact with a portion of the n-type heavily doped region and a portion of the p-type heavily doped region. The second metal layer comprises a first portion and a second portion. The first portion covers the source openings and is electrically connected to the first metal layer. The first portion covers the junction openings to form a Schottky contact with the second junction field-effect region. The second portion covers the gate openings and is electrically insulated from the first portion.

In summary, compared to the prior arts, the present invention achieves the effect through allocating the n-type heavily doped region, the p-type heavily doped region, the second junction field-effect region, the source opening and the junction opening in an identical cell. A Schottky diode is integrated in each cell and the width of channel formed on the p-type well between the n-type heavily doped region and the first junction field-effect region in each cell does not change. No additional chip area is required to form the Schottky diode. Accordingly, the total channel width of the present inventive silicon carbide semiconductor device is not affected as compared with conventional integrated devices. Thus the transistor specific on-resistance and current density are improved.

BRIEF DESCRIPTION OF THE DRAWINGS

FIG. 2B is an enlarged view of the X' region in FIG. 2A according to one preferred embodiment of the present invention;

FIG. 3B is a cross-sectional view taken along the line D-D in FIG. 3A;

DETAILED DESCRIPTION OF THE PREFERRED EMBODIMENTS

Figure 1:
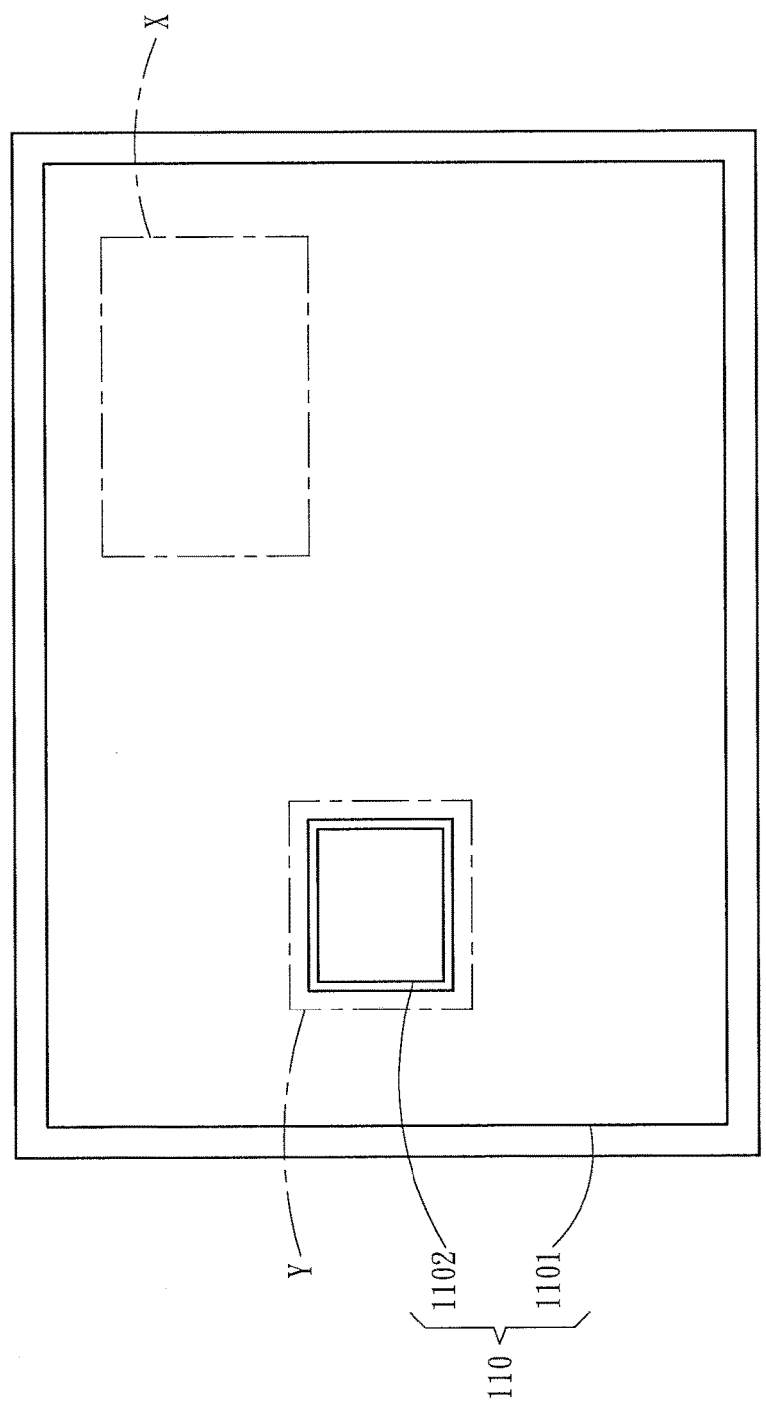
FIG. 1 is a schematic top view of the present inventive silicon carbide semiconductor device.
Figure 2A:
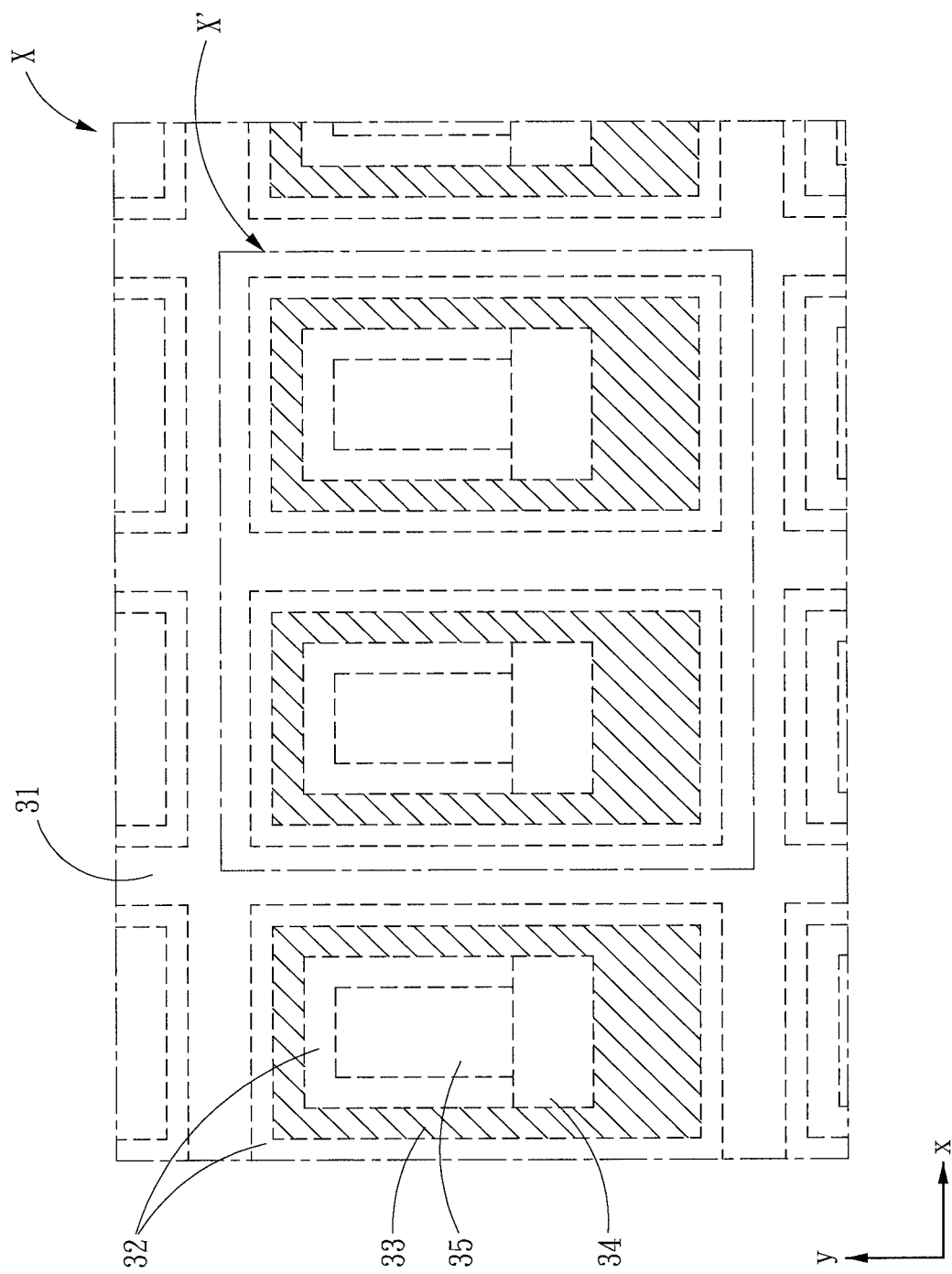
FIG. 2A is an enlarged view of the X region in FIG. 1 according to one preferred embodiment of the present invention.
Figure 3A:
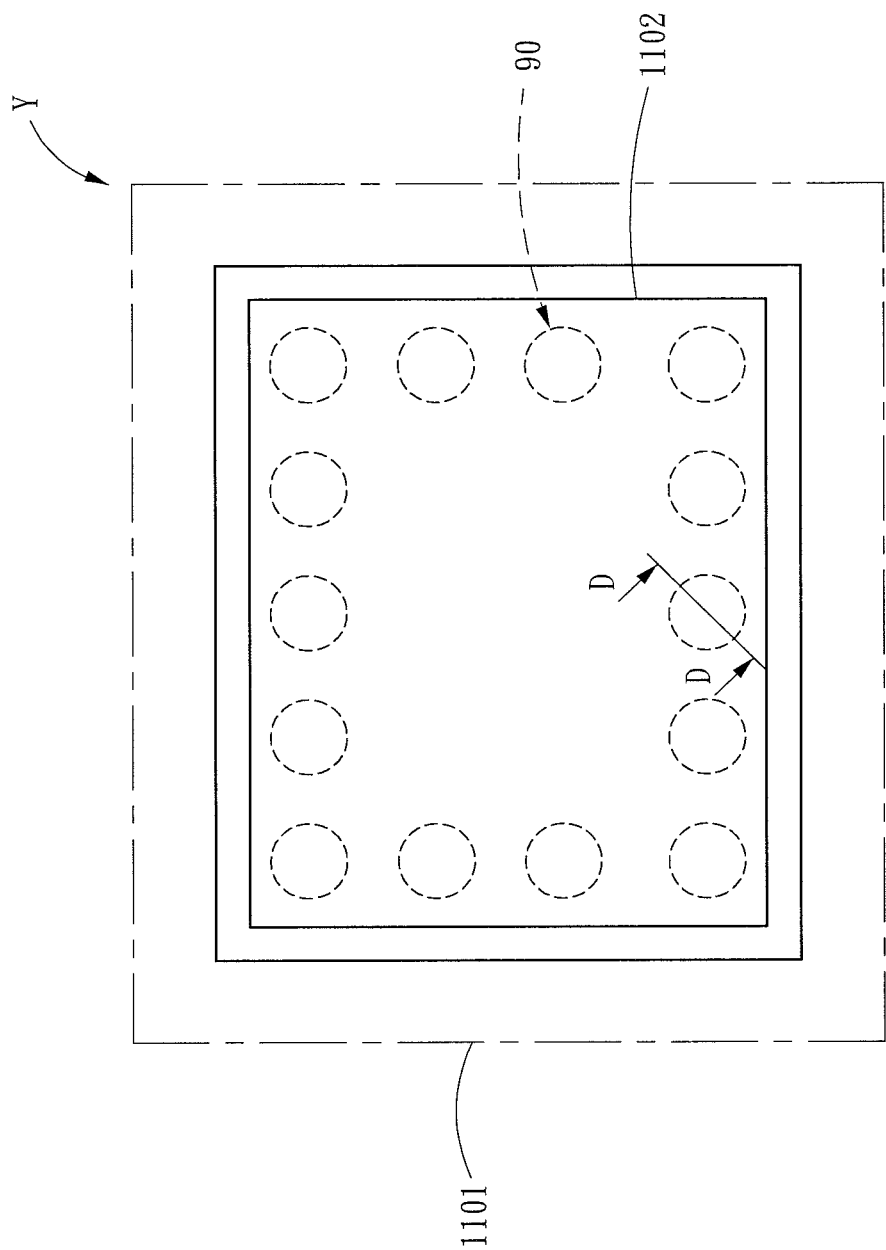
FIG. 3A is an enlarged view of the Y region in FIG. 1 according to one preferred embodiment of the present invention.

The detailed description and technical contents of the present invention will now be described with reference to the accompanying drawings as follows:

FIGS. 1, 2A-B and 3A-B show respectively a top view of the present invention, an enlarged view of the X region in FIG. 1 according to one preferred embodiment of the present invention, an enlarged view of the X' region in FIG. 2A, a cross-sectional view taken along the line A-A in FIG. 2B, a cross-sectional view taken along the line B-B in FIG. 2B, a cross-sectional view taken along the line C-C in FIG. 2B, an enlarged view of the Y region in FIG. 1 according to one preferred embodiment of the present invention, and a cross-sectional view taken along line D-D in FIG. 3A. The present invention discloses a silicon carbide semiconductor device, comprising a substrate 10, a n-type drift layer 20, a plurality of doped regions 30, a gate dielectric 40, a gate electrode 50, an interlayer dielectric 60, a plurality of source openings 70, a plurality of junction openings 80, a plurality of gate openings 90, a first metal layer 100 and a second metal layer 110. The substrate 10 is a 4H-SiC (silicon carbide) substrate. In one preferred embodiment, the substrate 10 is n-type heavily doped and has a resistivity less than 0.3 Ω·cm. The n-type drift layer 20 is provided on the substrate 10. In one preferred embodiment, the n-type drift layer 20 is n-type lightly doped and has a first doping concentration less than $5E17\ cm^{-3}$. In one preferred embodiment, when the rated voltage is 650V, for example, the first doping concentration is $1E16\ cm^{-3}$ and the thickness of the n-type drift layer 20 is 5 μm. As another example, when the rated voltage is 1200V, the first doping concentration is $6E15\ cm^{-3}$ and the thickness of the n-type drift layer 20 is 11 μm.

The doped regions 30 are disposed and spaced apart on the n-type drift layer 20 and a first junction field-effect region 31 is formed between the doped regions 30. In one embodiment, the first junction field-effect region 31 has a second doping concentration that is less than $1E18\ cm^{-3}$. In one preferred embodiment, the second doping concentration is between $1E16\ cm^{-3}$ to $2E17\ cm^{-3}$. The doped region 30 comprises a p-type well 32, a plurality of n-type heavily doped regions 33, a plurality of p-type heavily doped regions 34 and a plurality of second junction field-effect regions 35. Referring to FIG. 2A, as a top view, the outer contour of the p-type well 32, the n-type heavily doped region 33, the p-type heavily doped region 34 and the second junction field-effect region 35 can be square, rectangle, hexagonal or the combination thereof As an example, the outer contour as shown in the drawings is in a rectangular shape with a width parallel to the x-axis and a length parallel to the y-axis.

Turning to FIGS. 2B-E, from a top view, the p-type well 32 is formed in a rectangular ring shape, and the n-type heavily doped region 33 is disposed in the p-type well 32. The p-type heavily doped region 34 abuts the n-type heavily doped region 33 and overlaps with a portion of the p-type well 32. And the second junction field-effect region 35 is enclosed by the p-type well 32. A MOSFET channel is formed on the p-type well 32 between the n-type heavily doped region 33 and the first junction field-effect region 31, and the MOSFET channel has a first length L1, which defined as a distance between an edge of the n-type heavily doped region 33 and an edge of the first junction field-effect region 31. The distance between an edge of the n-type heavily doped region 33 and an edge of the second junction field-effect region 35 has a second length L2. In one embodiment, the second junction field-effect region 35 has a third doping concentration that is less than $1E18\ cm^{-3}$. In a preferred embodiment, the third doping concentration is between $1E16\ cm^{-3}$ to $2E17\ cm^{-3}$. In this embodiment, a portion of the second junction field-effect region 35 is enclosed by the p-type well 32 and the other portion thereof abuts the p-type heavily doped region 34. In another embodiment, however, the second junction field-effect region 35 is entirely enclosed by the p-type well 32 or completely enclosed by the p-type heavily doped region 34, both obtaining the purpose of the present invention. The first length L1, for example, is between 0.5 μm and 1 μm. And the second length L2 is equal to or greater than the first length L1.

In the present invention, the second doping concentration and the third doping concentration are greater than or equal to the first doping concentration respectively. In one embodiment, the first junction field-effect region 31 has a first depth D1 between 0.5 μm and 1 μm, the p-type well 32 has a second depth D2 between 0.5 μm and 1 μm, and the second junction field-effect region 35 has a third depth D3 between 0.5 μm and 1 μm. In the embodiment, the first depth D1 and the third depth D3 are greater than or equal to the second depth D2 respectively. As shown in FIG. 2D, the first depth D1 is equal to the third depth D3, and both are greater than the second depth D2 respectively. The p-type well 32, the n-type heavily doped region 33 and the p-type heavily doped region 34 have respectively a fourth doping concentration between $5E17$ $cm^{-3}$ to $3E18$ $cm^{-3}$, a fifth doping concentration between $5E18$ $cm^{-3}$ to $1E20$ $cm^{-3}$, and a sixth doping concentration between $5E18$ $cm^{-3}$ to $5E19$ $cm^{-3}$ respectively. The n-type heavily doped region 33 can be achieved by the implantation with phosphorous or nitrogen, while the p-type well 32 and the p-type heavily doped region 34 can be implanted with aluminum or boron, and the energy used is between 10 keV and 1400 keV.

Referring back to FIG. 2C, the gate dielectric 40 is provided on the n-type drift layer 20. The gate dielectric 40 is made of silicon oxide, nitrogen-containing silicon oxide or aluminum oxide and so on in the process of thermal oxidation, chemical vapor deposition (CVD) or atomic layer deposition (ALD) and so forth. The gate electrode 50 is provided on the gate dielectric 40 corresponding to the first junction field-effect region 31 on the other side. The material of the gate electrode 50 can be, for example, n-type heavily doped polysilicon (poly-Si) doped with phosphorous, or p-type heavily doped polysilicon doped with boron. The interlayer dielectric 60 is disposed on the gate dielectric 40 and the gate electrode 50. The material of the interlayer dielectric 60 can be tetraethylorthosilicate (TEOS), borophosphorsilicateglass (BPSG), oxynitride, undoped silicate glass (USG), silicon rich nitride (SRN), or the combination thereof.

The source opening 70 is formed by etching. The source opening 70 opens through the interlayer dielectric 60 and the gate dielectric 40 until a portion of the n-type heavily doped region 33 and a portion of the p-type heavily doped region 34 are reached, corresponding to the doped region 30. The source opening 70 and a neighbor source opening 70a is spaced apart by the gate electrode 50 and the interlayer dielectric 60.

Referring to FIG. 2D together with FIG. 2B, the junction opening 80 is formed through etching as well. The junction opening 80 passes through the interlayer dielectric 60 and the gate dielectric 40 until a portion of the second junction field-effect region 35, a portion of the p-type well 32, and a portion of the p-type heavily doped region 34 are reached. The junction opening 80 is disposed on top of and corresponding to the doped region 30 as well. And the junction opening 80 and a neighbor junction opening 80a are spaced by the gate electrode 50 and the interlayer dielectric 60.

Figure 2C:
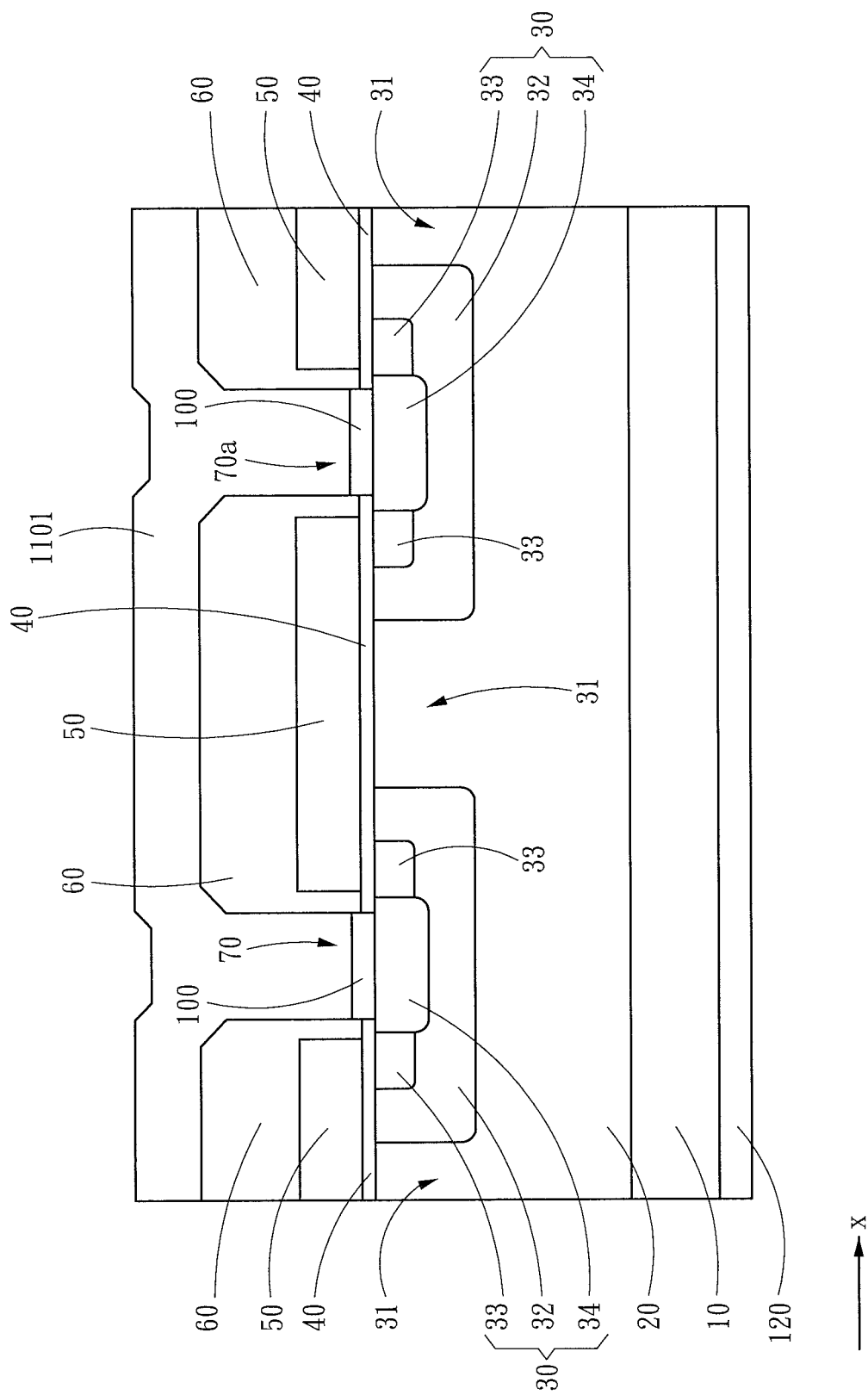
FIG. 2C is a cross-sectional view taken along the line A-A in FIG. 2B.
Figure 2D:
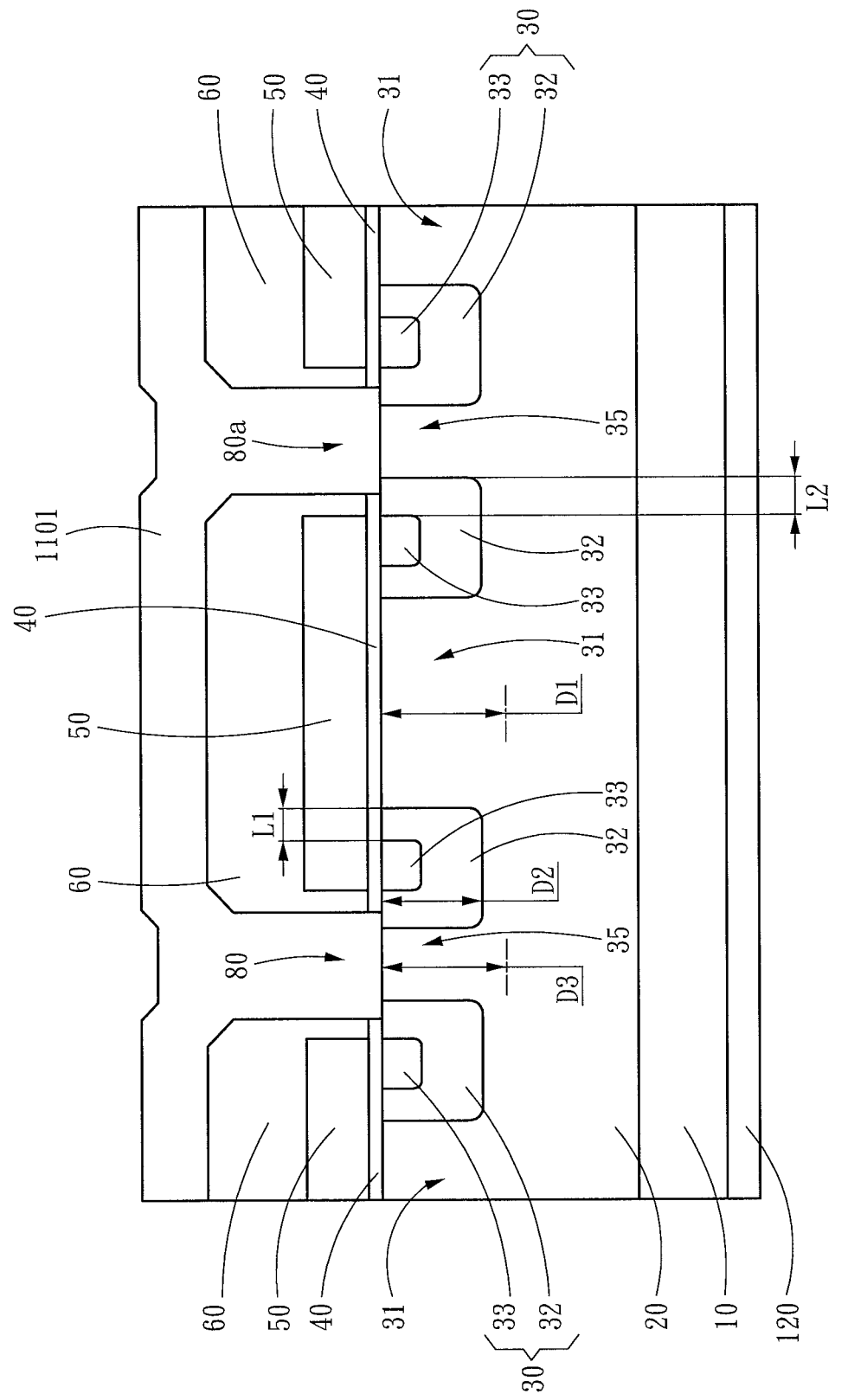
FIG. 2D is a cross-sectional view taken along the line B-B in FIG. 2B.
Figure 2E:
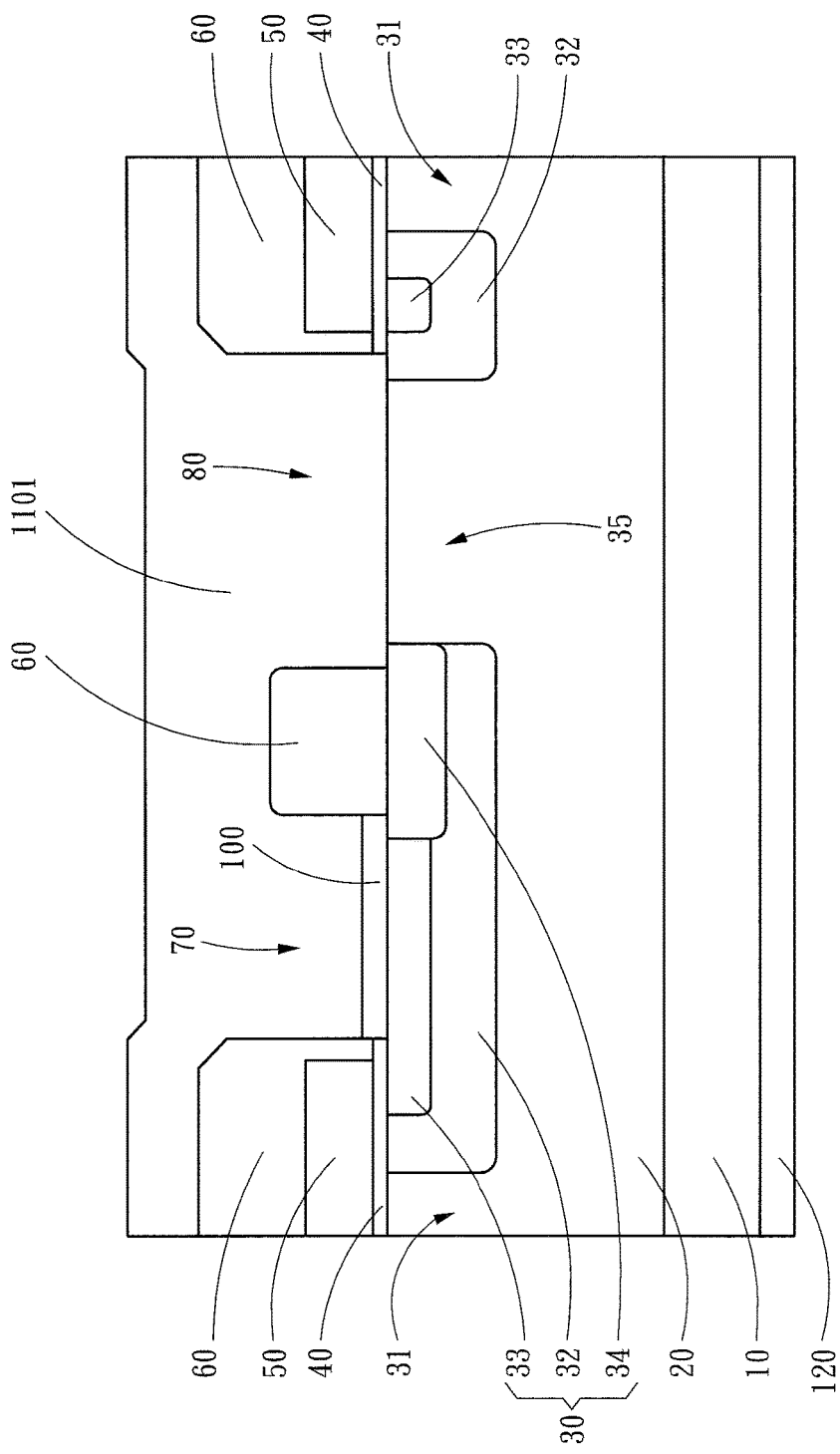
FIG. 2E is a cross-sectional view taken along the line C-C in FIG. 2B.

In the present invention, as shown in FIG. 2E, the junction opening 80 and the source opening 70 are spaced apart from each other and disposed in the regional area of one p-type well 32 to form a cell so as to make a good use of the area of the present inventive silicon carbide semiconductor device.

As an illustration, the doped region 30 is provided in a rectangular shape of the dimension as shown in FIG. 2B. In each of the cells, one of the p-type wells 32, one of the n-type heavily doped regions 33, one of the p-type heavily doped regions 34, one of the second junction field-effect regions 35, one of the source openings 70 and one of the junction openings 80 are provided. In another embodiment, however, the doped regions 30 can be longer stripes with longer lengths and shorter widths. In each of the cells, one of the p-type wells 32, one continuous n-type heavily doped region 33 or a plurality of the n-type heavily doped regions 33 spaced apart, a plurality of the p-type heavily doped region 34 spaced apart, a plurality of the second junction field-effect regions 35 spaced apart, a plurality of the source openings 70 spaced apart, and a plurality of the junction openings 80 spaced apart are provided.

As illustrated in FIG. 2C and FIG. 2E, the first metal layer 100 is disposed at the bottom side of the source opening 70. The material of the first metal layer 100 can be a silicide containing nickel, titanium, aluminum or the combination thereof. One preferred embodiment is a silicide containing nickel prepared in the process of deposition, such as physical vapor deposition (PVD) or chemical vapor deposition (CVD), and then annealing, etc. The first metal layer 100 is in contact with a portion of the n-type heavily doped region 33 and a portion of the p-type heavily doped region 34 to form an Ohmic contact. The specific contact resistance of Ohmic contact formed between the first metal layer 100 and the n-type heavily doped region 33 is for example smaller than $1E$-$4$ $\Omega \cdot cm^2$. The specific contact resistance of Ohmic contact formed between the first metal layer 100 and the p-type heavily doped region 34 is for example smaller than $0.1$ $\Omega \cdot cm^2$.

In reference to FIG. 2C and FIG. 2E together with FIG. 1, the second metal layer 110 is made of titanium, molybdenum, nickel, aluminum, titanium silicide, molybdenum silicide, nickel silicide, aluminum silicide, titanium nitride, aluminum-copper (AlCu) alloy, aluminum-silicon-copper alloy and so forth in the process of physical vapor deposition or chemical vapor deposition. In the present invention, the second metal layer 110 includes a first portion 1101 and a second portion 1102. The first portion 1101 covers the source openings 70 and is electrically connected to the first metal layer 100. The first portion 1101 also covers the junction openings 80 to form a Schottky contact with the second junction field-effect region 35, in which the Schottky contact is formed as a junction barrier Schottky (JBS) diode. The second portion 1102, as shown in 3B, covers the gate opening 90 and is not in contact with and electrically insulated from the first portion 1101.

Referring to FIGS. 3A and 3B, the gate opening 90 opens through the interlayer dielectric 60 to the gate electrode 50. In the embodiment, the gate opening 90 is formed by etching and disposed on the gate electrode 50. Further, a field oxide 51 is provided between the gate electrode 50 and the n-type drift layer 20.

Figure 4:
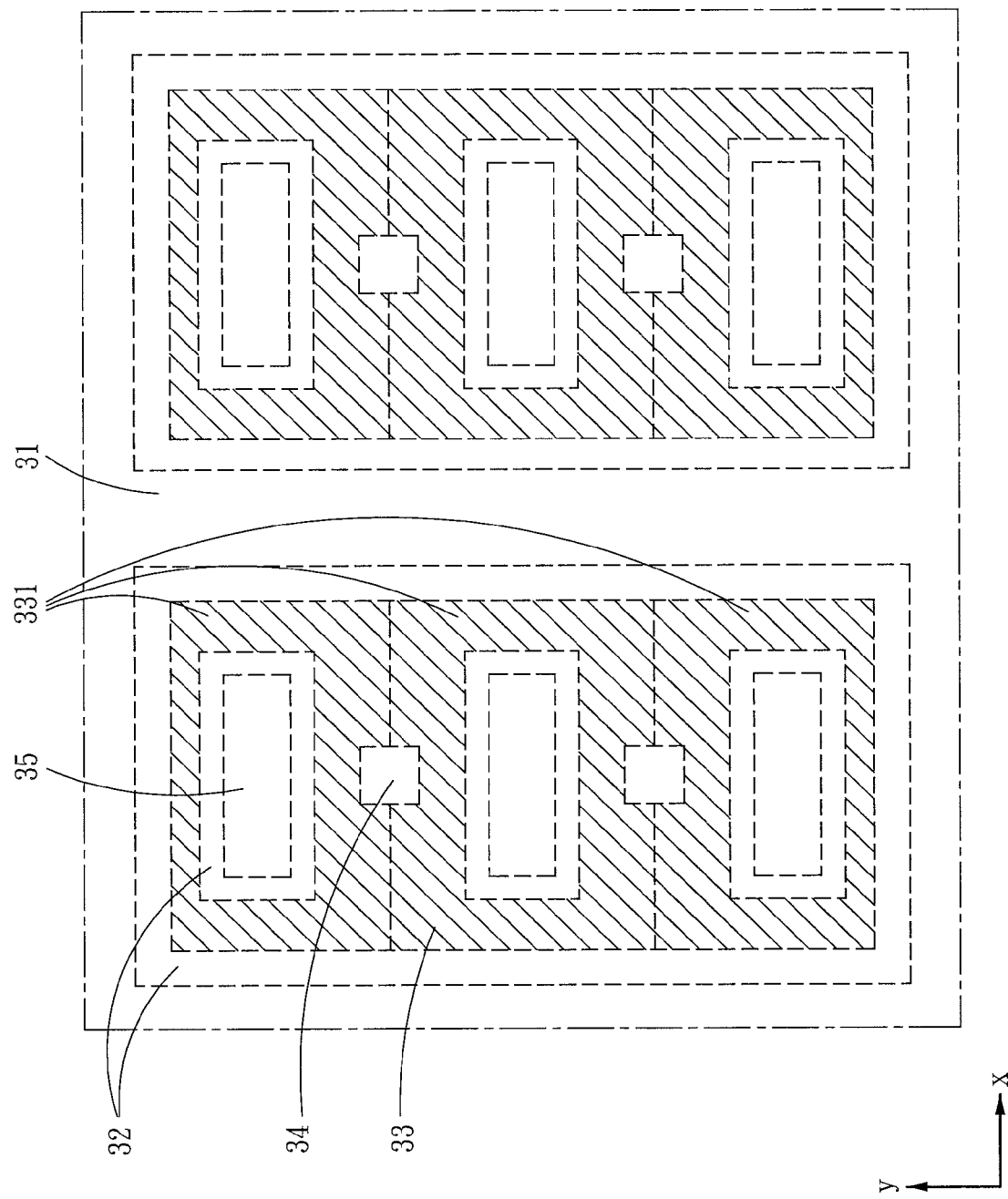
FIG. 4 is an illustrative view according to another preferred embodiment of the present invention.
Figure 5:
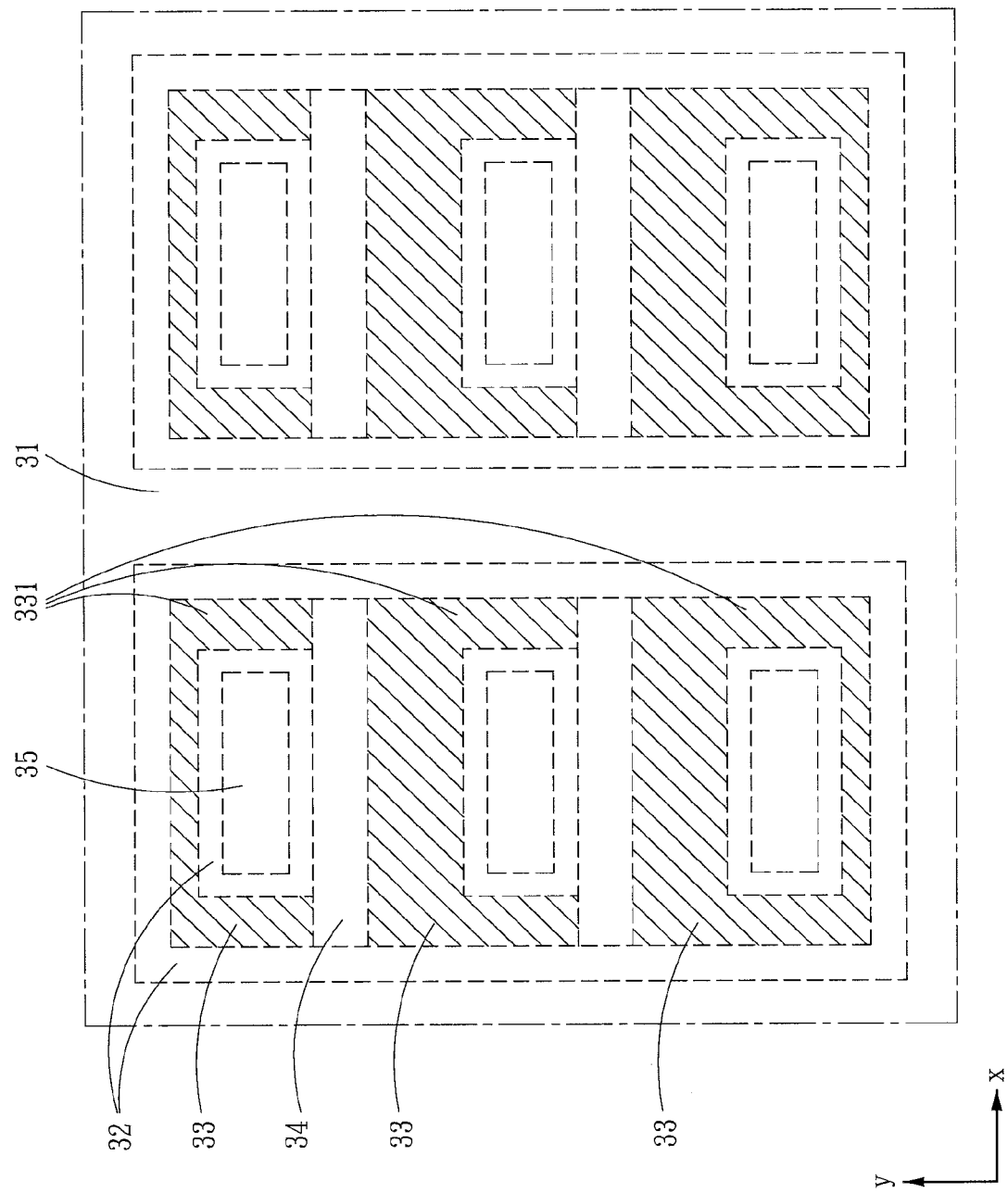
FIG. 5 is an illustrative view according to another alternate preferred embodiment of the present invention.

FIG. 4 is a schematic view of another embodiment of the present invention, which is also a top view as FIG. 2B. In the embodiment, the n-type heavily doped region 33 comprises a plurality of peripheral portions 331 adjacent to each other. The peripheral portions 331 are provided in a continuous form, inside each of which the second junction field-effect region 35 is formed. The p-type heavily doped region 34 is formed between the peripheral portions 331. FIG. 5 shows another alternate embodiment of the present invention, which is also a top view as FIG. 2B. FIG. 5 illustrates the n-type heavily doped region 33 is in a discontinuous form and comprises a plurality of the peripheral portions 331 disposed and spaced apart. The second junction field-effect region 35 is formed inside the peripheral portion 331, while the p-type heavily doped region 34 is formed between the peripheral portions 331 and sets the peripheral portions 331 apart.

In the present invention, the silicon carbide semiconductor device further comprises a drain 120 disposed on the side of the substrate 10 remote from the n-type drift layer 20, as shown in FIG. 2C. Accordingly, the silicon carbide semiconductor device is formed as an integrated device. The integrated device comprises a MOSFET and a junction barrier Schottky (JBS) diode in an anti-parallel connection to the MOSFET.

In view of the foregoing, the present invention provides the silicon carbide semiconductor device in which the n-type heavily doped region, the p-type heavily doped region, the second junction field-effect region, the source opening and the junction opening are disposed correspondingly in an identical cell, without occupying a portion of channel width. And no additional area needs to be allocated for Schottky diode, either. Accordingly, the total channel width of the present inventive silicon carbide semiconductor device is not affected as compared with conventional integrated devices. Thus the transistor specific on-resistance and current density are improved.

What is claimed is:

1. A silicon carbide semiconductor device, comprising:
an n-type heavily doped substrate;
an n-type drift layer disposed on the substrate, having a first doping concentration;
a plurality of doped regions disposed and spaced apart in the n-type drift layer, wherein a first junction field-effect region is formed between the doped regions, and each of the doped regions comprises a p-type well, an n-type heavily doped region disposed in the p-type well, a plurality of p-type heavily doped regions abutting the n-type heavily doped region and overlapping with a portion of the p-type well, and at least one second junction field-effect region enclosed by the p-type well;
a gate dielectric disposed on the n-type drift layer;
a gate electrode disposed on the gate dielectric;
an interlayer dielectric disposed on the gate dielectric and the gate electrode;
a plurality of source openings passing through the interlayer dielectric and the gate dielectric until a portion of the n-type heavily doped region and a portion of the p-heavily doped region are reached;
a plurality of junction openings passing through the interlayer dielectric and the gate dielectric until the second junction field-effect region, a portion of the p-type well and a portion of the p-type heavily doped region are reached;
a plurality of gate openings passing through the interlayer dielectric to the gate electrode;
a first metal layer disposed at the bottom side of the source opening to form an ohmic contact area contacting with a portion of the n-type heavily doped region and a portion of the p-type heavily doped region; and
a second metal layer comprising a first portion and a second portion, wherein the first portion covers the source openings and is electrically connected to the first metal layer; the first portion covers the junction openings to form a Schottky contact area contacting with the second junction field-effect region; and the second portion covers the gate openings and is electrically insulated from the first portion;
wherein the Schottky contact area is completely encircled by the n-type heavily doped region and the junction openings on a plane parallel to the bottom side of the source opening and separated by the source openings.

2. The silicon carbide semiconductor device as recited in claim 1, a distance between an edge of the n-type heavily doped region and an edge of the first junction field-effect region has a first length; and a distance between an edge of the n-type heavily doped region and an edge of the second junction field-effect region has a second length, wherein the second length is equal to or greater than the first length.

3. The silicon carbide semiconductor device as recited in claim 1, wherein the first junction field-effect region has a second doping concentration and the second junction field-effect region has a third doping concentration; and the second doping concentration and the third doping concentration are greater than or equal to the first doping concentration respectively.

4. The silicon carbide semiconductor device as recited in claim 3, wherein the second doping concentration and the third dopant concentration are both less than 1E18 cm$^{-3}$.

5. The silicon carbide semiconductor device as recited in claim 1, wherein the first doping concentration is less than 5E17 cm$^{-3}$.

6. The silicon carbide semiconductor device as recited in claim 1, wherein the p-type well has a first depth, the first junction field-effect region has a second depth and the second junction field-effect region has a third depth; wherein the second depth and the third depth are greater than or equal to the first depth respectively.

7. The silicon carbide semiconductor device as recited in claim 1, wherein the first metal layer comprises a silicide containing nickel.

8. The silicon carbide semiconductor device as recited in claim 1, wherein the material of the second metal layer is selected from the group consisting of titanium, molybdenum, nickel, aluminum, titanium silicide, molybdenum silicide, nickel silicide, aluminum silicide, titanium nitride, aluminum-copper alloy and aluminum-silicon-copper alloy.

9. The silicon carbide semiconductor device as recited in claim 1, wherein the n-type heavily doped region comprises a plurality of adjacent peripheral portions in a continuous form, the second junction field-effect region is formed inside the peripheral portion, and the p-type heavily doped region is formed between the peripheral portion.

10. The silicon carbide semiconductor device as recited in claim 1, wherein the n-type heavily doped region comprises a plurality of peripheral portions disposed and spaced apart in a discontinuous form, the second junction field-effect region is formed inside the peripheral portion and the p-type heavily doped region is formed between the peripheral portion s to set the peripheral portion s apart.

* * * * *